United States Patent [19]

Atkins

[11] 3,842,324

[45] Oct. 15, 1974

[54] INDUCTION-KEYED CONTROL CIRCUIT WITH KEYING NETWORK HAVING VARIABLE RESONANT FREQUENCY

[75] Inventor: Carl E. Atkins, Montclair, N.J.

[73] Assignee: Wager Electric Corporation, Parsippany, N.J.

[22] Filed: Oct. 27, 1972

[21] Appl. No.: 301,438

Related U.S. Application Data

[63] Continuation of Ser. No. 145,308, May 20, 1971, abandoned.

[52] U.S. Cl......... 317/146, 317/DIG. 2, 340/258 B, 340/258 C, 331/65

[51] Int. Cl........................................... H01h 47/22

[58] Field of Search.............. 317/DIG. 2, 146, 134; 340/258 B, 258 C; 331/65

[56] References Cited

UNITED STATES PATENTS 3,469,204 9/1969 Magyar et al...................... 317/146

*Primary Examiner*—William M. Shoop, Jr.

*Attorney, Agent, or Firm*—Eyre, Mann & Lucas

[57] ABSTRACT

A control circuit including an oscillator is actuated by a passive keying network which, when inductively coupled to the oscillator tank circuit, will effect amplitude modulation of the normally-constant oscillator output. The keying network comprises a tuned circuit in which the net capacitance is variable by means of a semiconductor diode having a sharply variable junction capacitance. The resonant frequency of the tuned circuit is continuously varied when inductively coupled to the oscillator tank circuit, thereby continuously altering the keying network's ability to absorb electromagnetic energy from the tank circuit in the oscillator of the control circuit.

12 Claims, 2 Drawing Figures

PATENTED OCT 15 1974 3,842,324

INVENTOR
CARL E. ATKINS
BY
Eyre, Mann & Lucas
ATTORNEYS

INDUCTION-KEYED CONTROL CIRCUIT WITH KEYING NETWORK HAVING VARIABLE RESONANT FREQUENCY

CROSS-REFERENCE TO RELATED APPLICATIONS

This application is a continuation of Ser. No. 145,308, filed on May 20, 1971, and now abandoned.

The present invention represents a significant advance over copending application Ser. No. 126,463 filed on Mar. 24, 1971 in the names of Carl E. Atkins and Paul A. Carlson and now U.S. Pat. No. 3,712,730.

BACKGROUND OF THE INVENTION

The present invention relates to control circuitry actuable by an inductively-coupled, variably-tuned keying circuit. In the circuit disclosed in the cross-referenced application, the oscillator is either producing oscillations of constant magnitude to cause the control circuit to maintain a load in a first energization state, or the oscillations are constantly suppressed by an inductive keying circuit to cause the load to be placed in a second energization state. It has been found that, when the sensitivity of this circuit is adjusted so that the placement of the keying circuit is not hypercritical, the circuit can be actuated or "keyed" by simply placing a piece of metal near the inductance of the tank circuit of the control circuit oscillator, this being sufficient to absorb enough energy to cause a change in the energization state of a controlled load. In addition, it is relatively easy for an unauthorized person to construct a resonant circuit with variable components and merely tune it to the correct frequency after placing the inductive component in proximity to the inductance in the tank circuit. It is the aim of the present invention to overcome these advantages by providing a control circuit which will not respond to such manipulations. More specifically, applicant's present control circuit will provide an output capable of altering the energization state of a load only when the output of the oscillator therein is amplitude modulated, with the frequency of such modulation being too high to be manually or mechanically induced. In order to cause this condition in the control circuit oscillator, a keying network has been devised to have a variable resonant frequency, thereby varying its ability to absorb energy from the tank circuit when inductively coupled thereto. To achieve this capability in the keying network, a semiconductor diode having a slow recovery time is employed as a variable capacitance. The junction capacitance of the diode varies substantially due principally to sharp fluctuations in diffusion capacitance between periods of current conductivity, during which there is a large diffusion capacitance, and periods of non-conductivity during which there is no diffusion capacitance after a brief delay following the appearance of a net back bias on the diode.

SUMMARY OF THE INVENTION

The present invention is embodied in and carried out by a keying network operative to continuously vary its own resonant frequency when coupled to the tank circuit of an oscillator. In this fashion, the ability of the keying network to absorb energy from the oscillator tank circuit is continuously varied, thereby causing a modulated oscillator output as long as the keying network and the oscillator tank circuit are coupled.

BRIEF DESCRIPTION OF THE DRAWING

The present invention may be best understood by reading the written description in connection with the accompanying drawing, in which.

DESCRIPTION OF THE PREFERRED EMBODIMENT

Figure 1:
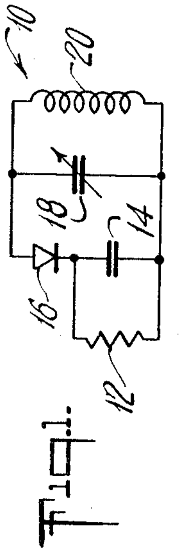
FIG. 1 is a schematic circuit diagram of the preferred embodiment of the keying network employed with the control circuit embodying applicant's invention.

Referring now specifically to FIG. 1, the keying network 10 comprises a resistance 12 (330K ohms) connected across a fixed capacitance 14 (470 picofarads), this parallel combination being connected in series with a diode 16 (IN5059, IN5060 or IN464A) which is poled so as to have its anode connected to one terminal of inductance 20, with the other terminal of inductance 20 being connected to the capacitance 14. Optionally, a variable capacitance 18 may be connected across inductance 20 if the keying network is to be tuned with respect to the oscillator tank circuit frequency, in which case tuning capacitance 22 may be omitted from the oscillator. The keying network 10 is passive, i.e., it does not include a source of electrical power.

The keying network 10 may be formed in a compact manner and then enclosed in some article normally worn by a person authorized to use same, e.g., a ring, bracelet, watchband or the like. When so disguised, the inductance 20 of the keying network must be in such a position that inductive coupling with the tank circuit inductance in the control circuit oscillator may be effected. Similar considerations are involved in mounting the inductance in the tank circuit of the control circuit oscillator. If the disclosed circuit is employed to control access to the interior of an automobile, the tank circuit inductance also must be situated in a convenient location on the automobile's exterior, and should be well disguised.

Figure 2:
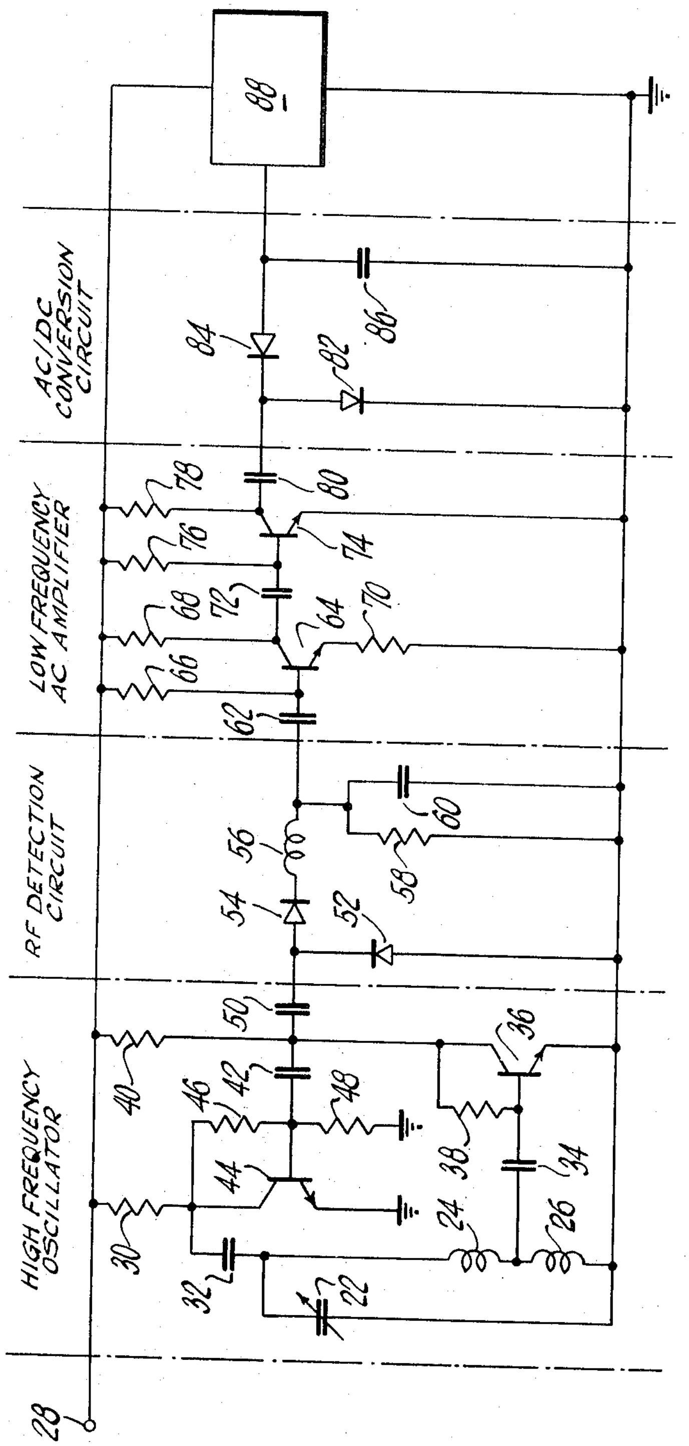
FIG. 2 is a schematic circuit diagram of the preferred embodiment of the control circuit actuated by the keying network of FIG. 1.

Referring now specifically to FIG. 2, the control circuit shown schematically in this figure essentially comprises a high-frequency oscillator, with an RF detection circuit being provided for detecting the envelope of the output of the oscillator. This output may then be further modified prior to utilization by a low-frequency AC amplifier for amplifying only the alternating-current output of the detection circuit, and an AC/DC conversion circuit for transforming the output of the low-frequency amplifier into a DC control voltage. The oscillator may have an output of any suitable radio frequency, e.g., 2 Megahertz, which may be modulated by the keying network at a frequency in the range from 1 to 50 Kilohertz. The oscillator includes a tank circuit formed by a capacitance 22 (50 picofarads) which is connected in parallel with an inductance formed by series-connected inductors 24 (33 microhenries) and 26 (1 microhenry). A +12 volt DC power source is connected to the circuit at terminal 28, with current-limiting resistance 30 (1K ohms) and capacitance 32 (5 picofarads) connected in series between terminal 28 and the tank circuit. Preferably, the tank circuit has a high impedance so that the voltage developed across its terminals will drop precipitously when a relatively small amount of energy is absorbed from the circuit by the keying network 10. This characteristic is achieved by deriving a signal from a relatively small portion of the total inductance of the tank circuit and by feeding that signal through capacitance 34 (100 picofarads) to the base of transistor 36, which is biased by resistance 38 (220K ohms). Loading of the tank circuit is thus minimized. The amplified output of transistor 36 is derived at the junction of its collector and current-limiting resistance 40 (1K ohms), and is fed through capacitance 42 (1 nanofarad) to the base of transistor 44, which is biased to saturation by resistances 46 and 48. The amplified output of transistor 44 is derived at the junction of its collector and resistance 30, and is fed into the tank circuit through capacitance 32, thus providing the feedback necessary to maintain normal oscillation. Transistor 44 is normally driven well into its saturation region, so that the fluctuations occurring in the output of transistor 36 in the normal operation of the control circuit will not cause any significant variations in the feedback signal which is the output of transistor 44.

The oscillator is normally operative to generate a high-frequency oscillatory output of substantially constant amplitude. However, when the inductance 20 of the keying network 10 is inductively coupled to the inductance 24–26 of the oscillator, or to a substantial portion thereof, this high-frequency oscillatory output is amplitude modulated. This result is achieved by the varying ability of the keying network 10 to absorb energy from the tank circuit of the oscillator. When the inductance 20 of the keying network 10 is inductively coupled to the major portion 24 of the oscillator inductance 24–26, a voltage is induced across inductance 20, thereby causing a charging current to flow through diode 16 to capacitance 14. A large diffusion capacitance (about 200 picofarads) is thus formed in the semiconductor material of diode 16, which capacitance is combined with capacitance 14 and optional capacitance 18 to bring the resonant frequency of the keying network closer to the frequency of the oscillator tank circuit, thereby causing the absorption of a substantial amount of energy from the tank circuit. This transfer of energy from the oscillator tank circuit to the keying circuit results in a severe drop in the voltage across the tank circuit, which causes the oscillator output to decrease sharply. The plate of capacitance 14 is directly coupled to the cathode of diode 16, and as capacitance 14 becomes increasingly positively charged, the magnitude of the current flowing from anode to cathode of diode 16 is progressively diminished. Thus, the diffusion capacitance of diode 16 decreases sharply to zero shortly after a net back bias voltage is impressed across the terminals of the diode. This sharp, delayed turn-off of diode 16 causes an equally sharp reduction in the ability of the keying circuit 10 to absorb energy from the tank circuit of the high-frequency oscillator. The sharpness of the turn-off of diode 16 is due to the delay in turn-off following back-biasing of the diode, which delay is a consequence of stored charges on opposite sides of the semiconductor junction in the diode. This stored charge enables minority carriers to cross this junction even through it is back-biased. When the diode 16 finally reacts to the back-bias of capacitance 14, it reacts precipitously, causing a sudden disappearance of the current-controlled diffusion capacitance component of the total junction capacitance of the diode. The less significant voltage-controlled depletion capacitance component of the total junction capacitance of diode 16 also decreases the voltage across capacitance 14 increases, due to the widening of the depletion layer in the semi-conductor material of the diode. Thus, in effect, the diode 16 acts as a DC current- and voltage-controlled variable capacitance. The aforementioned phenomena act to suddenly detune the keying network by sharply reducing the total junction capacitance of diode 16, thus reducing the net capacitance connected across the inductance 20 and the resonant frequency of the tuned circuit in keying network 10. Consequently, the ability of the keying network 10 to absorb energy from the oscillator tank circuit is diminished. Therefore, the voltage across the tank circuit and the oscillator output rise to approximately their normal values. However, capacitance 14 now discharges through resistance 12, thereby reducing the back bias on diode 16, with the result that the junction capacitance of diode 16 is increased by the decreasing width of the depletion layer. When the net bias across the terminals of diode 16 is forward and current begins to flow from anode to cathode, the large diffusion capacitance will again be suddenly formed in the semiconductor material of diode 16. Thus, the resonant frequency of the keying network 10 is suddenly brought closer to the frequency of the oscillator tank circuit, and the ability of the keying network 10 to absorb energy from the tank circuit is sharply increased. Consequently, the voltage across the oscillator tank circuit again drops sharply, thereby causing the oscillator output to undergo a similar decrease. This continuing interaction between the keying network 10 and the oscillator tank circuit will be repeated at a low modulating frequency, i.e., low relative to the frequency of the output of the oscillator, so long as the inductive coupling between the inductance 20 of the keying network 10 and the major portion 24 of the oscillator tank circuit inductance 24–26 is maintained. In this fashion, an amplitude-modulated continuous wave oscillator output is produced at the collector of the first-stage amplifier transistor 36. The signal derived at this point is both the intermediate signal in the feedback loop and the oscillator output signal, which is fed through capacitance 50 (1 nanofarad) to the RF detection circuit. The negative portion of this high-frequency, variable amplitude input signal to the detection circuit is shunted to ground through diode 52. The positive portion passes through diode 54, and the high-frequency components thereof are severely attenuated by the RF choke inductance 56, while the low-frequency and DC components pass through inductance 56 with relatively little attenuation. The high-frequency components are further diminished by being shunted to ground through the relatively low-impedance network formed by resistance 58 and capacitance 60, which appears as a relatively high impedance to the low-frequency and DC components. The low-frequency AC wave plus DC component thus developed comprises the output of the detection circuit, which is fed to the low-frequency amplifier as the input.

This input is fed through DC-blocking capacitance 62 to the base of first-stage transistor 64, which is biased and current-limited by resistances 66, 68 and 70. The output of this first stage is derived at the junction of the collector of transistor 64 and resistance 68, and is fed through capacitance 72 to the base of second-stage transistor 74, which is biased and current-limited by resistances 76 and 78. The output of this second stage is derived at the junction of collector of transistor 64 and resistance 78, and is fed through blocking capacitance 80 to the AC/DC conversion circuit. It will be apparent that, when the envelope of the high-frequency output of the oscillator is unmodulated, the amplifier will have a null output.

The amplified, low-frequency AC input to the conversion circuit has its positive portion shunted to ground via diode 82, while the negative portion is passed through diode 84 to charge capacitance 86 negatively. It will be readily appreciated that, by poling the diodes in a contrary manner, a positive output voltage will be developed across capacitance 86. The polarity of the output voltage may be dictated by the nature of the load 88, which may be a three-terminal semiconductor device operative to control a current path directly, or by means of an intermediate relay if a high current-handling capability is required. Alternatively, the load 88 may itself be a suitably sensitive relay, such as a reed relay.

The advantages of the present invention, as well as certain changes and modifications of the disclosed embodiment thereof, will be readily apparent to those skilled in the art. It is the applicant's intention to cover all those changes and modifications which could be made to the embodiment of the invention herein chosen for the purposes of the disclosure without departing from the spirit and scope of the invention.

What is claimed is:

1. An induction-keyed control circuit comprising:

1. passive keying network means including a tuned circuit having a current- and voltage-controlled variable capacitance, and operative to vary the resonant frequency of said tuned circuit between upper and lower limits when coupled to
2. keyable circuit means normally operative when connected to a source of direct-current power to generate a first, constant output signal and operative in response to the coupling of said keying network means thereto to generate a second, modulated output signal.

2. The control circuit according to claim 1 wherein said passive keying network means comprises:

1. a first inductance in said tuned circuit;
2. a semiconductor diode having a delayed recovery time, comprising said current- and voltage-controlled variable capacitance in said tuned circuit; and
3. bias means operative to continuously cause fluctuations in the value of said current- and voltage-controlled variable capacitance when said first inductance is coupled to said keyable circuit means.

3. The control circuit according to claim 2 wherein said bias means comprises:

1. a first, fixed capacitance connected in a charging path comprising said first inductance and said diode; and
2. a resistance connected in parallel with said first, fixed capacitance to form a discharge path.

4. The control circuit according to claim 2 wherein said passive keying network means further comprises a second, variable capacitance connected in parallel with said first inductance to enable adjustment of the range of resonant frequencies of said keying network means.

5. The control circuit according to claim 1 wherein said keyable circuit means comprises an oscillator including a tank circuit having a second inductance, at least a portion of said second inductance being disposed for coupling with said passive keying network means.

6. The control circuit according to claim 5 wherein said oscillator includes a feedback loop comprising:

1. a first transistor amplifier which derives its input signal from said tank circuit by means of a connection between first and second portions of said second inductance; and
2. a second transistor amplifier driven by the output of said first transistor amplifier to provide an inphase feedback signal to said tank circuit.

7. The control circuit according to claim 6 wherein the output of said first transistor amplifier comprises the output of said keyable circuit means.

8. The control circuit according to claim 6 wherein the output of said second transistor amplifier is maintained constant regardless of variations in the output of said first transistor amplifier by driving said second transistor amplifier to saturation.

9. The control circuit according to claim 5, further comprising detection means operative to produce an output corresponding to the envelope of the oscillator output.

10. The control circuit according to claim 9, further comprising amplifier means operative to amplify only the alternating current components of said output of said detection means.

11. The control circuit according to claim 10, further comprising conversion means operative to convert the alternating current output of said amplifier means to a direct current output.

12. An induction-keyed control circuit comprising:

1. passive keying network means including a turned circuit having a first inductance and a variable capacitance, and bias means operative to continuously cause fluctuations in the value of said variable capacitance when said first inductance is coupled to
2. a second inductance in the tank circuit of an oscillator, said oscillator being normally operative when connected to a source of direct current power to generate an unmodulated high-frequency output signal, and operative in response to the coupling of said first inductance of said keying network to said second inductance of said tank circuit to generate a modulated high-frequency output signal;
3. a radio-frequency detection circuit operative to provide an output corresponding to the envelope of the oscillator output;
4. a low-frequency alternating-current amplifier operative to amplify only the alternating current components of said detection circuit output; and
5. A conversion circuit operative to convert the alternating current output of said low frequency alternating current amplifier to a direct current output.

* * * * *

UNITED STATES PATENT OFFICE

CERTIFICATE OF CORRECTION

Patent No. 3,842,324 Dated October 15, 1974

Inventor(s) Carl E. Atkins

It is certified that error appears in the above-identified patent and that said Letters Patent are hereby corrected as shown below:

Assignee: "Wager Electric Corporation" should read --Wagner Electric Corporation--

Col. 1, Line 39: "advantages" should read --disadvantages--

Col. 4, Line 5: --as-- should be inserted between "decreases" and "the voltage"

Signed and sealed this 4th day of February 1975.

(SEAL)
Attest:

McCOY M. GIBSON JR.
Attesting Officer

C. MARSHALL DANN
Commissioner of Patents